US012610598B2

(12) United States Patent

Nago et al.

(10) Patent No.: US 12,610,598 B2

(45) Date of Patent: Apr. 21, 2026

(54) NITRIDE SEMICONDUCTOR, SEMICONDUCTOR DEVICE, AND METHOD FOR MANUFACTURING THE NITRIDE SEMICONDUCTOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hajime Nago, Yokohama (JP); Jumpei Tajima, Mitaka (JP); Toshiki Hikosaka, Kawasaki (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 911 days.

(21) Appl. No.: 17/816,562

(22) Filed: Aug. 1, 2022

(65) Prior Publication Data

US 2023/0138962 A1 May 4, 2023

(30) Foreign Application Priority Data

Oct. 28, 2021 (JP) ................................. 2021-176091

(51) Int. Cl.
| | |
|---|---|
| *H10D 62/85* | (2025.01) |
| *H10D 62/17* | (2025.01) |
| *H10D 62/60* | (2025.01) |

(52) U.S. Cl.
CPC ....... *H10D 62/8503* (2025.01); *H10D 62/393* (2025.01); *H10D 62/60* (2025.01)

(58) Field of Classification Search
None
See application file for complete search history.

(56) References Cited

U.S. PATENT DOCUMENTS

| | | | |
|---|---|---|---|
| 9,520,286 B2 | 12/2016 | Shikauchi et al. | |
| 10,529,842 B2 | 1/2020 | Shikauchi et al. | |
| 2016/0111273 A1* | 4/2016 | Shikauchi | ......... H01L 21/02507 |
| | | | 438/495 |

FOREIGN PATENT DOCUMENTS

| | | |
|---|---|---|
| JP | 2014-022698 A | 2/2014 |
| JP | 2014-236050 A | 12/2014 |

(Continued)

OTHER PUBLICATIONS

Machine Translation of JP 2015002329 A (Year: 2015).*

(Continued)

*Primary Examiner* — Sue A Purvis
*Assistant Examiner* — Carnell Hunter, III
(74) *Attorney, Agent, or Firm* — Oblon, McClelland, Maier & Neustadt, L.L.P.

(57) ABSTRACT

According to one embodiment, a nitride semiconductor includes a base body including boron, a first nitride region including $Al_{x1}Ga_{1-x1}N$ ($0.98 < x1 \leq 1$), and a second nitride region including $Al_{x2}Ga_{1-x2}N$ ($0 \leq x2 < 1$, $x2 < x1$). A concentration of boron in the base body is not less than $1 \times 10^{19}$ $cm^{-3}$. The first nitride region is between the base body and the second nitride region. The first nitride region includes a first surface facing the base body and a second surface facing the second nitride region. A second concentration of boron in the second surface is not more than $1/8000$ of a first concentration of boron in the first surface.

15 Claims, 8 Drawing Sheets

(56)  References Cited

FOREIGN PATENT DOCUMENTS

| | | | | |
|---|---|---|---|---|
| JP | 2015-2329 | A | | 1/2015 |
| JP | 2015002329 | A | * | 1/2015 |
| JP | 5756830 | B2 | | 7/2015 |
| JP | 2017-69450 | A | | 4/2017 |

OTHER PUBLICATIONS

Japanese Office Action issued Mar. 31, 2025 in Japanese Patent Application No. 2021-176091, (with unedited computer-generated English translation), 9 pages.

* cited by examiner

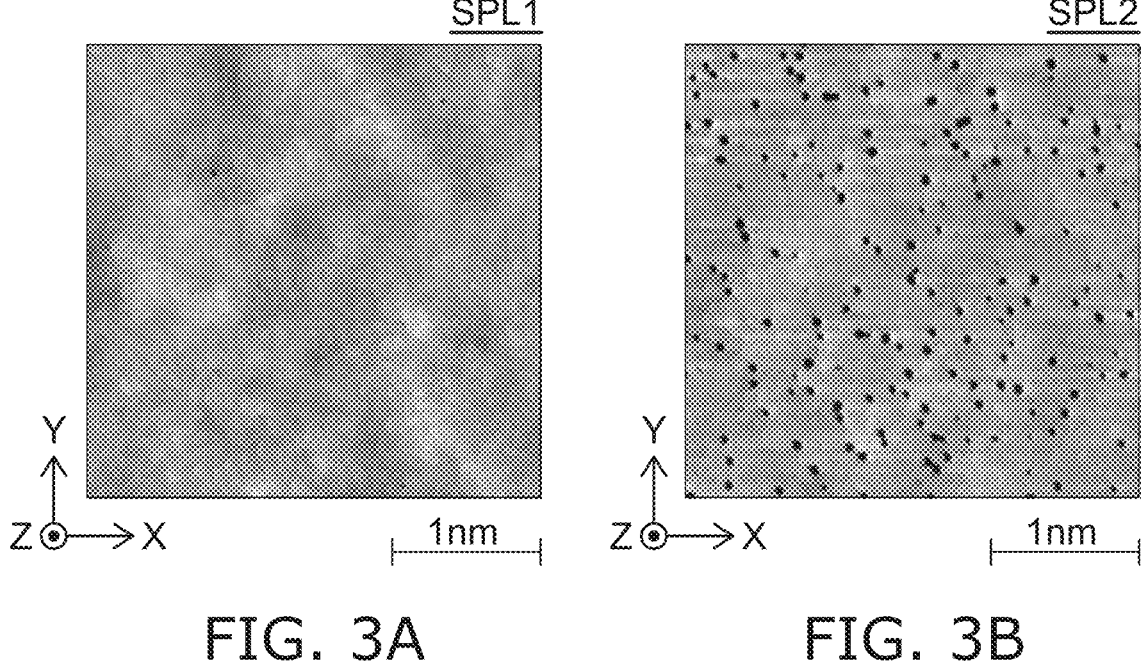
FIG. 3A                    FIG. 3B

NITRIDE SEMICONDUCTOR, SEMICONDUCTOR DEVICE, AND METHOD FOR MANUFACTURING THE NITRIDE SEMICONDUCTOR

CROSS-REFERENCE TO RELATED APPLICATIONS

This application is based upon and claims the benefit of priority from Japanese Patent Application No. 2021-176091, filed on Oct. 28, 2021; the entire contents of which are incorporated herein by reference.

FIELD

Embodiments described herein relate generally to a nitride semiconductor, a semiconductor device, and a method for manufacturing the nitride semiconductor.

BACKGROUND

For example, there is a semiconductor device using a nitride semiconductor such as GaN. It is desired to improve the characteristics of semiconductor devices.

BRIEF DESCRIPTION OF THE DRAWINGS

FIGS. 3A and 3B are images illustrating the nitride semiconductor;

DETAILED DESCRIPTION

Figure 1:
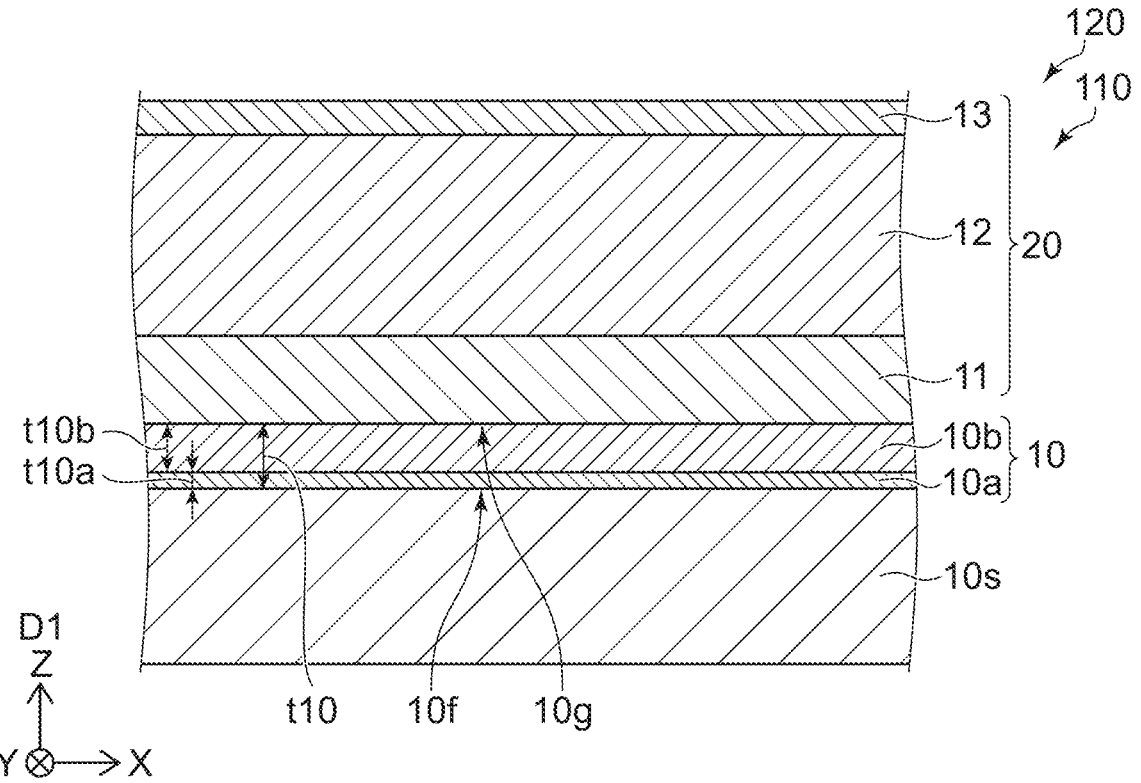
FIG. 1 is a schematic cross-sectional view illustrating a nitride semiconductor according to a first embodiment.

According to one embodiment, a nitride semiconductor includes a base body including boron, a first nitride region including $Al_{x1}Ga_{1-x1}N$ (0.98<x1≤1), and a second nitride region including $Al_{x2}Ga_{1-x2}N$ (0≤x2<1, x2<x1). A concentration of boron in the base body is not less than $1×10^{19}$ $cm^{-3}$. The first nitride region is between the base body and the second nitride region. The first nitride region includes a first surface facing the base body and a second surface facing the second nitride region. A second concentration of boron in the second surface is not more than ⅛₀₀₀ of a first concentration of boron in the first surface.

According to one embodiment, a method for manufacturing a nitride semiconductor is disclosed. The method can include forming a part of a first nitride region on a base body including boron at a first temperature. The first nitride region includes $Al_{x1}Ga_{1-x1}N$ (0.98<x1≤1). A concentration of boron in the base body is not less than $1×10^{19}$ $cm^{-3}$. The method can include forming an other part of the first nitride region on the part of the first nitride region at a second temperature higher than the first temperature. The method can include forming a second nitride region on the other part of the first nitride region. The second nitride region includes $Al_{x2}Ga_{1-x2}N$ (0≤x2<1, x2<x1).

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a nitride semiconductor according to a first embodiment.

As shown in FIG. 1, a nitride semiconductor 110 according to the embodiment includes a base body 10s, a first nitride region 10 and a second nitride region 20. The first nitride region 10 is between the base body 10s and the second nitride region 20.

The base body 10s includes boron. A concentration of boron in the base body 10s is not less than $1×10^{19}$ $cm^{-3}$. The base body 10s includes silicon. The base body 10s is, for example, a silicon substrate.

The first nitride region 10 includes $Al_{x1}Ga_{1-x1}N$ (0.98<x1≤1). The first nitride region 10 includes, for example, AlN. The first nitride region 10 is, for example, an AlN layer.

The second nitride region 20 includes $Al_{x2}Ga_{1-x2}N$ (0≤x2<1, x2<x1). The second nitride region 20 includes at least one of an AlGaN layer or a GaN layer.

In this example, the second nitride region 20 includes a first nitride layer 11. The first nitride layer 11 includes $Al_{y1}Ga_{1-y1}N$ (0<y1<1, y1<x1). The first nitride layer 11 is, for example, an AlGaN layer. In one example, a composition ratio y1 is not less than 0.2 and not more than 0.5. For example, the first nitride layer 11 is in contact with the first nitride region 10. A first direction D1 from the base body 10s to the first nitride region 10 is defined as a Z-axis direction. One direction perpendicular to the Z-axis direction is defined as an X-axis direction. A direction perpendicular to the Z-axis direction and the X-axis direction is defined as a Y-axis direction.

The base body 10s, the first nitride region 10 and the second nitride region 20 are along the X-Y plane. The first nitride region 10 and the second nitride region 20 are layered substantially parallel to the X-Y plane.

In this example, the second nitride region 20 includes a second nitride layer 12 and a third nitride layer 13. The second nitride layer 12 is between the first nitride layer 11 and the third nitride layer 13 in the first direction D1. The second nitride layer 12 includes $Al_{y2}Ga_{1-y2}N$ (0≤y2<1). A composition ratio y2 is, for example, not less than 0 and not more than 0.1. The second nitride layer 12 is, for example, a GaN layer. The third nitride layer 13 includes $Al_{y3}Ga_{1-y3}N$ (y2<y3<x1). A composition ratio y3 is, for example, not less than 0.15 and not more than 0.3. The third nitride layer 13 is, for example, an AlGaN layer.

The second nitride layer 12 includes a region facing the third nitride layer 13. A carrier region is formed in this region. The carrier region is, for example, a two-dimensional electron gas.

The nitride semiconductor 110 is used as a semiconductor device 120. The semiconductor device 120 includes the nitride semiconductor 110. The carrier region is used in the operation of the semiconductor device 120. The second nitride layer 12 and the third nitride layer 13 are, for example, functional layers.

The first nitride layer 11 functions, for example, as a part of a buffer layer. The first nitride region 10 functions, for example, as at least a part of the buffer layer. By providing the buffer layer, warpage is suppressed in the structure including the base body 10s, the first nitride region 10 and the second nitride region 20. Good crystallinity is obtained in the functional layer.

As described above, the base body 10s includes boron. Thereby, for example, in the structure including the base body 10s, the first nitride region 10 and the second nitride region 20, the warpage is suppressed more effectively. When the base body 10s includes boron, conductivity is generated in the base body 10s. For example, the influence of static electricity is suppressed. Practical nitride semiconductors and semiconductor devices can be easily obtained.

When the base body 10s includes boron, the boron may diffuse toward the functional layer. For example, when boron diffuses into the buffer layer including Al and Ga (for example, the first nitride layer 11), the buffer layer tends to be non-uniform. It is preferable that the boron included in the base body 10s is blocked in the first nitride region 10 and the diffusion of boron is suppressed.

As shown in FIG. 1, the first nitride region 10 includes a first surface 10f and a second surface 10g. The first surface 10f faces the base body 10s. The second surface 10g faces the second nitride region 20. A concentration of boron on the first surface 10f is high due to the influence of boron included in the base body 10s. On the other hand, a concentration of boron is low on the second surface of 10g. For example, in the first nitride region 10, the concentration of boron drops sharply.

It was found that the concentration of boron changes depending on the formation conditions of the first nitride region 10. Hereinafter, an example of the profile of the concentration of boron in the structure including the first nitride region 10 and the second nitride region 20 will be described.

Figures 2A, 2B:
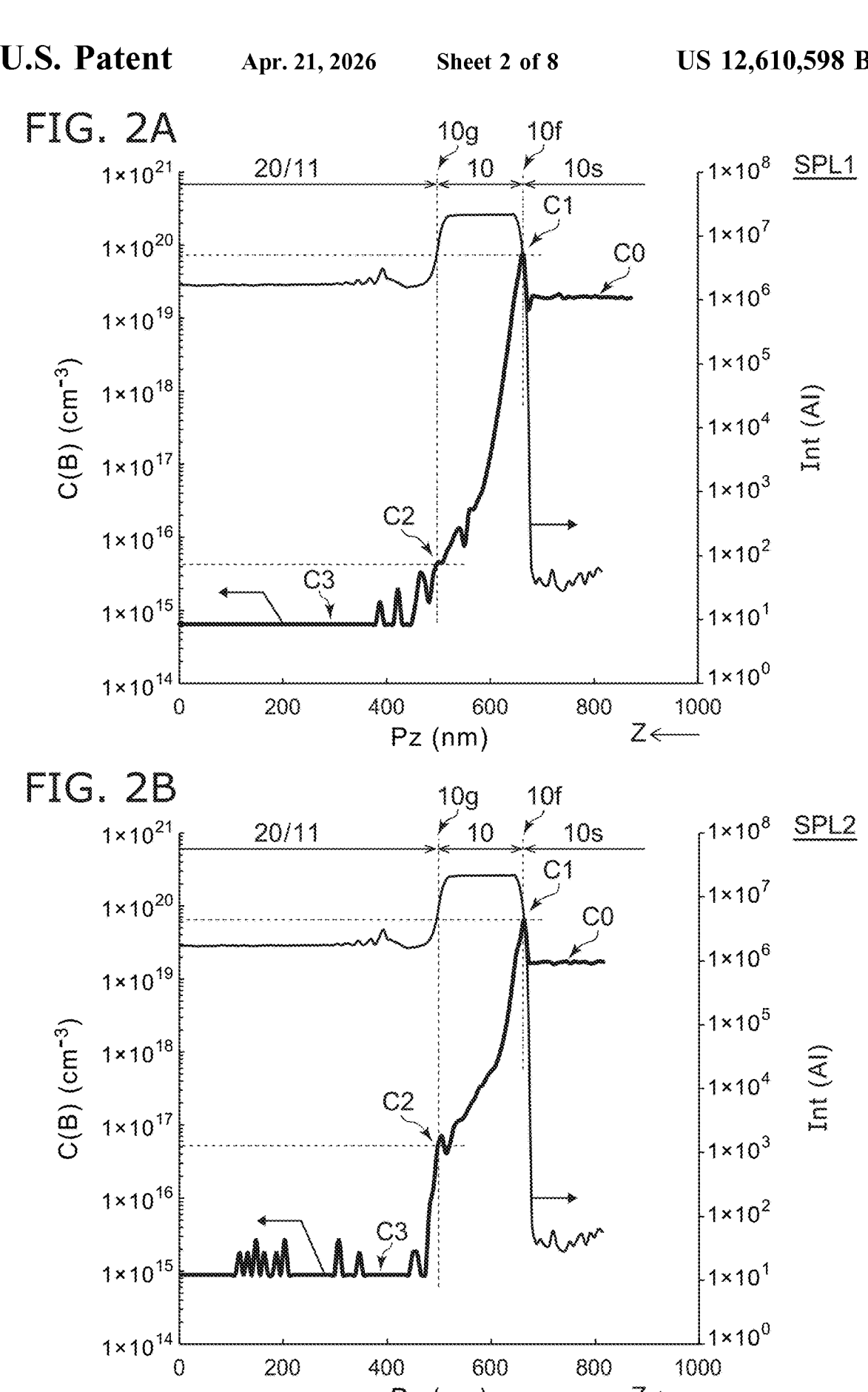
FIGS. 2A and 2B are graphs illustrating the nitride semiconductor.

FIGS. 2A and 2B are graphs illustrating the nitride semiconductor.

FIG. 2A corresponds to a sample of a first configuration SPL1. FIG. 2B corresponds to a sample of a second configuration SPL2. These figures are results of SIMS (Secondary Ion Mass Spectrometry) analysis of the sample. The horizontal axis is a position Pz in the Z-axis direction. The vertical axis on the left side is the boron concentration C(B). The vertical axis on the left side is the Al ion intensity Int (Al).

The nitride region is formed by, for example, a MOCVD method or the like using a gas including a raw material including aluminum and a raw material including nitrogen. In the first configuration SPL1, the first nitride region 10 is formed by being divided into two portions. As shown in FIG. 1, a part of the first nitride region 10 (first portion 10a) is formed at a low first temperature. Another part of the first nitride region 10 (second portion 10b) is formed at a second temperature higher than the first temperature. In this example, the first temperature is 830° C. The second temperature is 1040° C. A thickness t10a of the first portion 10a is about 20 nm. A thickness t10b of the second portion 10b is about 180 nm. A thickness t10 of the first nitride region 10 is about 200 nm. In the second configuration SPL2, the entire first nitride region 10 is formed at the second temperature. In these configurations, the first nitride region 10 is AlN.

In these samples, the first nitride layer 11 (at least a part of the second nitride region 20) is formed on the first nitride region 10. In this example, the first nitride layer 11 includes $Al_{y1}Ga_{1-y1}N$ ($0<y1<1$, $y1<x1$). In this example, the composition ratio y1 is 0.48.

As shown in FIG. 2A, in the first configuration SPL1, the concentration of boron on the first surface 10f of the first nitride region 10 (first concentration C1) is $7\times10^{19}$ cm$^{-3}$. The concentration of boron on the second surface 10g of the first nitride region 10 (second concentration C2) is $4\times10^{15}$ cm$^{-3}$. The concentration of boron in the first nitride layer 11 (third concentration C3) is $6\times10^{14}$ cm$^{-3}$. For example, the third concentration C3 is not more than $6\times10^{14}$ cm$^{-3}$ (not more than detection limit). In the first configuration SPL1, the boron concentration C(B) drops sharply in the first nitride region 10. Boron diffusion is effectively suppressed.

As shown in FIG. 2B, in the second configuration SPL2, the concentration of boron on the first surface 10f of the first nitride region 10 (first concentration C1) is $7\times10^{19}$ cm$^{-3}$. The concentration of boron on the second surface 10g of the first nitride region 10 (second concentration C2) is $5\times10^{16}$ cm$^{-3}$. The concentration of boron in the first nitride layer 11 (third concentration C3) is $9\times10^{14}$ cm$^{-3}$. In the second configuration SPL2, the decrease in the boron concentration C(B) is insufficient in the first nitride region 10. Suppression of the diffusion of boron in the second configuration SPL2 is insufficient as compared with the first configuration SPL1.

FIGS. 3A and 3B are images illustrating the nitride semiconductor.

These figures are AFM (Atomic Force Microscope) images of the sample. FIG. 3A corresponds to the first configuration SPL1. FIG. 3B corresponds to the second configuration SPL2. These AFM images are AFM images on the surface of the first nitride region 10. In these AFM images, the first nitride layer 11 is not formed.

As shown in FIG. 3B, in the second configuration SPL2, multiple dark spots are observed in the image. The multiple dark spots are pits. On the other hand, as shown in FIG. 3A, no dark spot is observed in the first configuration SPL1. In the first configuration SPL1, high flatness is obtained on the surface of the first nitride region 10.

In the first configuration SPL1, the first nitride region 10 is formed at two stages of temperature. It is believed that the formation of the first portion 10a at the lower first temperature continuously and uniformly covers the surface of the boron-including base body 10s. Then, formation of the second portion 10b at the high second temperature gives AlN with high crystal quality. It is considered that the diffusion of boron is suppressed by continuously and uniformly covering the surface of the base body 10s including boron.

On the other hand, in the second configuration SPL2, the entire first nitride region 10 is formed at the high second temperature. In this case, it is considered that AlN is continuously formed on the surface of the base body 10s including boron. For example, the nucleus that is the source of the pit is formed, and the pit is formed. Boron included in the base body 10s is considered to diffuse upward through, for example, pits.

As described above, there is a difference in the uniformity (for example, pits) of the first nitride region 10 between the first configuration SPL1 and the second configuration SPL2. The difference in uniformity is the difference in the profile of boron.

Figure 4A:
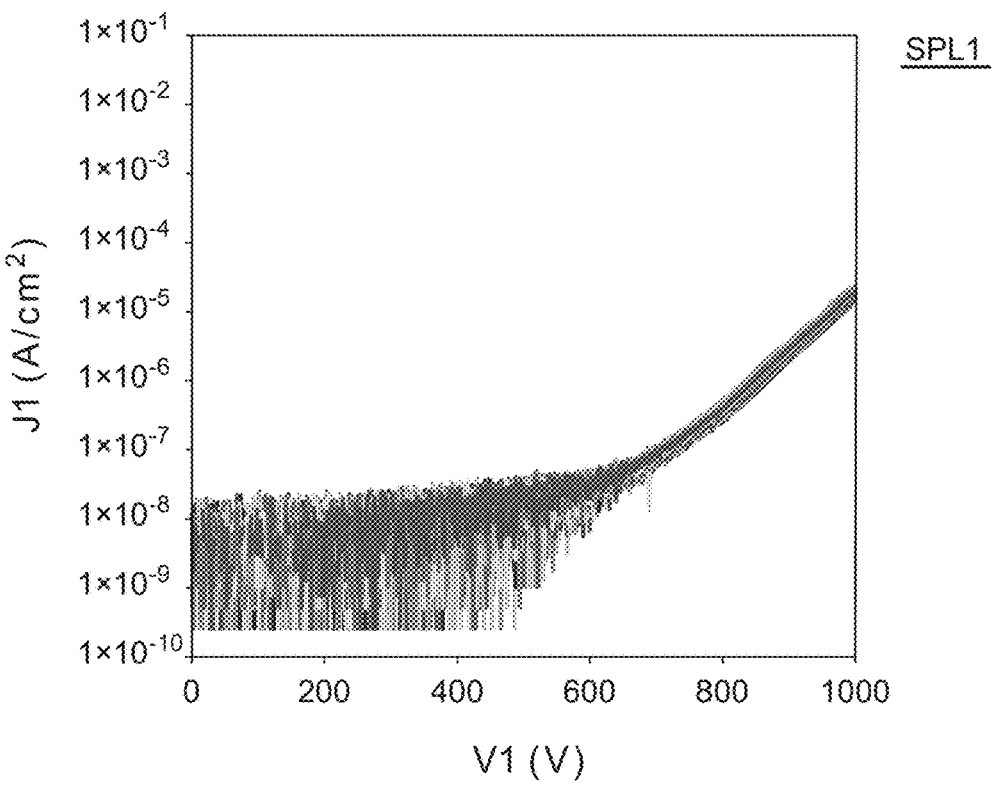
FIGS. 4A and 4B are graphs illustrating characteristics of the nitride semiconductor.
Figure 4B:
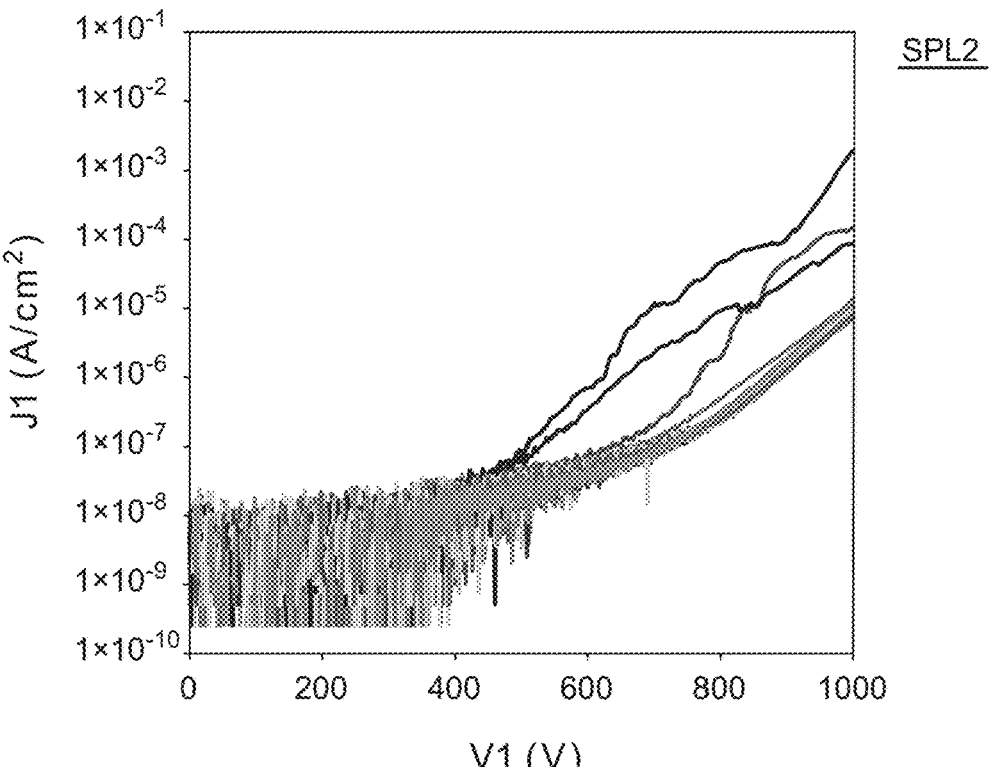

As will be described below, such a difference in the first nitride region 10 causes a difference in leakage current. FIGS. 4A and 4B are graphs illustrating characteristics of the nitride semiconductor.

These figures illustrate electrical characteristics of the sample. In the sample, a first electrode electrically connected to the base body 10s is provided. A second electrode electrically connected to the second nitride region 20 is formed on an upper surface of the second nitride region 20. The current (leakage current) when a voltage is applied to these electrodes is measured. The horizontal axis of FIGS. 4A and 4B is an applied voltage Vl. The vertical axis is a current density 31 of the leak current. FIG. 4A corresponds to the first configuration SPL1. FIG. 4B corresponds to the second configuration SPL2. The characteristics of the six measurement samples are illustrated in each of the first configuration SPL1 and the second configuration SPL2.

As shown in FIG. 4A, in the first configuration SPL1, the current density 31 is relatively low and fluctuation is small. As shown in FIG. 4B, in the second configuration SPL2, the current density 31 is high and fluctuation is large. As described above, the leakage current can be suppressed in the first configuration SPL1.

It is considered that such a difference in the leakage current is based on the difference in the first nitride region 10 as described above (for example, the presence or absence of a pit). It is considered that such a difference in the leakage current is due to the difference in the profile of boron in the first nitride region 10.

As described with respect to FIG. 2A, in the first configuration SPL1, the boron concentration C(B) drops sharply in the first nitride region 10. In this example, the second concentration C2 is $\frac{1}{14000}$ of the first concentration C1. In the embodiment, the second concentration C2 may be not more than $\frac{1}{10000}$ of the first concentration C1. The second concentration C2 may be not more than $\frac{1}{8000}$ of the first concentration C1. In the first nitride region 10 where the boron concentration C(B) drops sharply, for example, the pits can be suppressed and the leakage current can be suppressed.

As shown in FIGS. 2A and 2B, in this example, in the first configuration SPL1 and the second configuration SPL2, a boron concentration C0 in the base body 10s is $1.5 \times 10^{19}$ cm$^{-3}$. Even at such a high boron concentration C0, in the first configuration SPL1, the boron concentration C(B) sharply decreases in the first nitride region 10. This is due to the fact that the diffusion of boron is effectively suppressed in the first configuration SPL1. The second concentration C2 may be not more than $\frac{1}{2500}$ of the boron concentration C0 in the base body 10s.

On the other hand, a reference example in which the boron concentration C0 in the base body 10s is less than $1 \times 10^{19}$ cm$^{-3}$ can be considered. In the reference example, the second concentration C2 on the second surface 10g may be low. It is considered that this is due to the rate-determining supply of boron because the boron concentration C0 in the base body 10s is low. However, in the reference example in which the boron concentration C0 in the base body 10s is low, it is difficult to obtain desired characteristics (suppression of warpage and appropriate conductivity).

In the embodiment, even in the case of the base body 10s having the boron concentration C0 of not less than $1 \times 10^{19}$ cm$^{-3}$, the diffusion of boron can be effectively suppressed by the appropriate first nitride region 10.

As shown in FIG. 2A, the first concentration C1 of boron on the first surface 10f is higher than the boron concentration C0 on the base body 10s. The first surface 10f corresponds to the interface between the base body 10s and the first nitride region 10. Boron is likely to be localized at the interface.

As shown in FIG. 2A, the third concentration C3 of boron in the second nitride region 20 (in this example, the first nitride layer 11) is not more than the second concentration C2. In the embodiment, the third concentration C3 is preferably not more than $1 \times 10^{16}$ cm$^{-3}$. In the embodiment, the second concentration C2 is preferably not more than $8 \times 10^{16}$ cm$^{-3}$. In the embodiment, the first concentration C1 is preferably not less than $5 \times 10^{19}$ cm$^{-3}$. As shown in FIG. 1, the thickness t10 of the first nitride region 10 is preferably not less than 100 nm and not more than 250 nm. The thickness t10 is the thickness of the first nitride region 10 in the first direction D1 from the base body 10s to the first nitride region 10.

Figure 5:
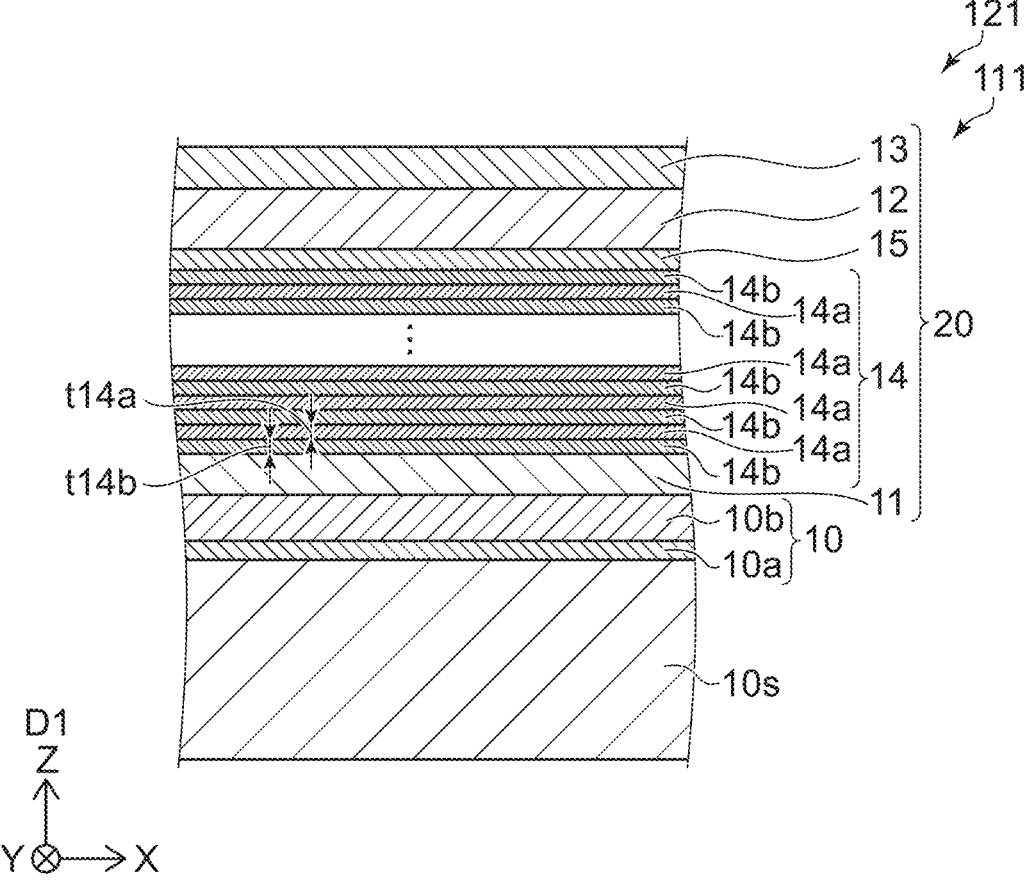
FIG. 5 is a schematic cross-sectional view illustrating a nitride semiconductor according to the first embodiment.

FIG. 5 is a schematic cross-sectional view illustrating a nitride semiconductor according to the first embodiment.

As shown in FIG. 5, in a nitride semiconductor 111 according to the embodiment, the second nitride region 20 includes is a fourth nitride layer 14 in addition to the first nitride layer 11, the second nitride layer 12, and the third nitride layer 13. In this example, the second nitride region 20 further includes a fifth nitride layer 15. Except for the above, the configuration of the nitride semiconductor 111 may be the same as that of the nitride semiconductor 110.

The fourth nitride layer 14 is between the first nitride layer 11 and the second nitride layer 12. In this example, the fourth nitride layer 14 is between the first nitride layer 11 and the fifth nitride layer 15.

The fourth nitride layer 14 includes multiple first films 14a and multiple second films 14b. The multiple first films 14a include Al$_{z1}$Ga$_{1-z1}$N ($0 \leq z1 < 1$). The multiple second films 14b include Al$_{z2}$Ga$_{1-z2}$N ($0 < z2 \leq 1$, $z1 < z2$). The multiple first films 14a are, for example, GaN films or AlGaN films. The multiple second films 14b are, for example, AlN films. One of the multiple second films 14b is between one of the multiple first films 14a and another one of the multiple first films 14a in the first direction D1. One of the multiple first films 14a is between one of the multiple second films 14b and another one of the multiple second films 14b in the first direction D1. For example, the first film 14a and the second film 14b are alternately provided. In this example, one of the multiple second films 14b is in contact with the first nitride layer 11. In this example, another one of the multiple second films 14b is in contact with the fifth nitride layer 15. One of the multiple first films 14a and one of the multiple second films 14b may be in contact with the first nitride layer 11. One of the multiple first films 14a and one of the multiple second films 14b may be in contact with the fifth nitride layer 15 or the second nitride layer 12.

A thickness t14a of the multiple first films 14a in one first direction D1 is not less than 20 nm or more and not more than 30 nm or less. A thickness t14b of the multiple second films 14b in one first direction D1 is not less than 3 nm and not more than 8 nm. The fourth nitride layer 14 is, for example, a superlattice layer. By providing the fourth nitride layer 14, for example, high crystallinity can be easily obtained.

The fifth nitride layer 15 is provided between the fourth nitride layer 14 and the second nitride layer 12. The fifth nitride layer 15 includes Al$_{y5}$Ga$_{1-y5}$N ($0 \leq y5 < 1$, $y5 < x1$). The fifth nitride layer 15 includes, for example, carbon. The fifth nitride layer 15 is, for example, a GaN layer including carbon. The fifth nitride layer 15, for example, suppresses dislocations and provides higher crystallinity.

Second Embodiment

The second embodiment relates to a semiconductor device. As shown in FIG. 1, the semiconductor device 120 according to the embodiment includes at least a part of the nitride semiconductor 110 according to the embodiment. As shown in FIG. 5, a semiconductor device 121 according to the embodiment includes at least a part of the nitride semiconductor 111 according to the embodiment. As described below, the semiconductor device may include electrodes.

Figure 6:
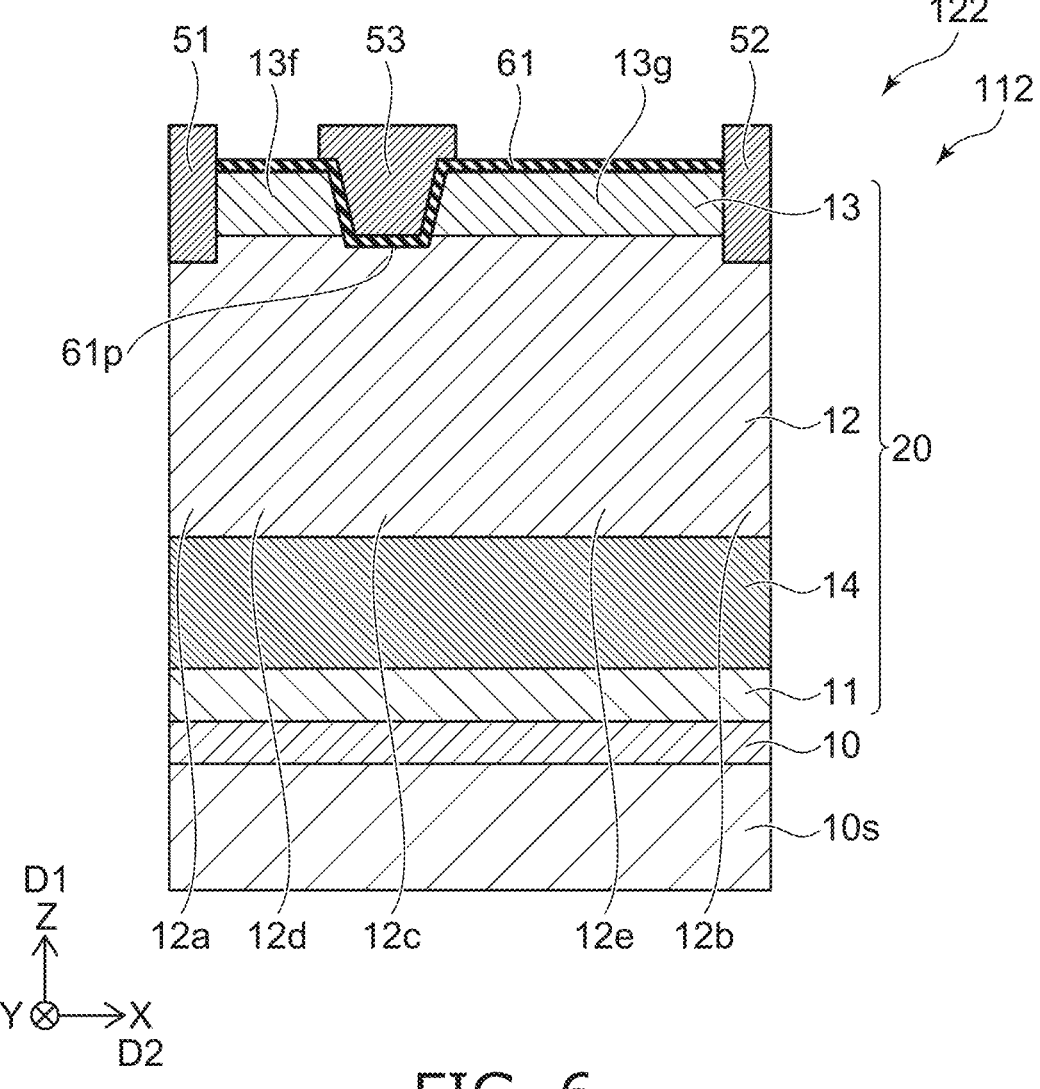
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, a semiconductor device 122 according to the second embodiment includes a nitride semiconductor 112 according to the first embodiment, first to third electrodes 51 to 53, and an insulating member 61. In the nitride semiconductor 112, the fifth nitride layer 15 is omitted. Similar to the nitride semiconductor 111, the fifth nitride layer 15 may be provided in the nitride semiconductor 112.

A direction from the first electrode 51 to the second electrode 52 is along a second direction D2. The second direction D2 crosses the first direction D1. The second direction D2 is, for example, the X-axis direction.

A position of the third electrode 53 in the second direction D2 is between a position of the first electrode 51 in the second direction D2 and a position of the second electrode 52 in the second direction D2.

The second nitride layer 12 includes a first partial region 12a, a second partial region 12b, a third partial region 12c, a fourth partial region 12d, and a fifth partial region 12e. A direction from the first partial region 12a to the first electrode 51 is along the first direction D1. A direction from the second partial region 12b to the second electrode 52 is along the first direction D1. A position of the third partial region 12c in the second direction D2 is between a position of the first partial region 12a in the second direction D2 and a position of the second partial region 12b in the second direction D2. A direction from the third partial region 12c to the third electrode 53 is along the first direction D1. The fourth partial region 12d is between the first partial region 12a and the third partial region 12c in the second direction D2. The fifth partial region 12e is between the third partial region 12c and the second partial region 12b in the second direction D2.

The third nitride layer 13 includes a sixth partial region 13f and a seventh partial region 13g. A direction from the fourth partial region 12d to the sixth partial region 13f is along the first direction D1. A direction from the fifth partial region 12e to the seventh partial region 13g is along the first direction D1. The insulating member 61 includes a first insulating region 61p. At least a part of the first insulating region 61p is provided between the third partial region 12c and the third electrode 53 in the first direction D1.

A current flowing between the first electrode 51 and the second electrode 52 can be controlled by a potential of the third electrode 53. The potential of the third electrode 53 may be, for example, a potential based on a potential of the first electrode 51. The first electrode 51 functions, for example, as a source electrode. The second electrode 52 functions, for example, as a drain electrode. The third electrode 53 functions, for example, as a gate electrode. The first insulating region 61p functions, for example, as a gate insulating film. The semiconductor device 122 is, for example, a transistor.

As described above, the second nitride layer 12 includes a region facing the third nitride layer 13. A carrier region (for example, a two-dimensional electron gas) is formed in this region. The semiconductor device 122 is, for example, a HEMT (High Electron Mobility Transistor).

In this example, at least a part of the third electrode 53 is between the sixth partial region 13f and the seventh partial region 13g. The semiconductor device 122 is, for example, a normally-off type transistor.

Figure 7:
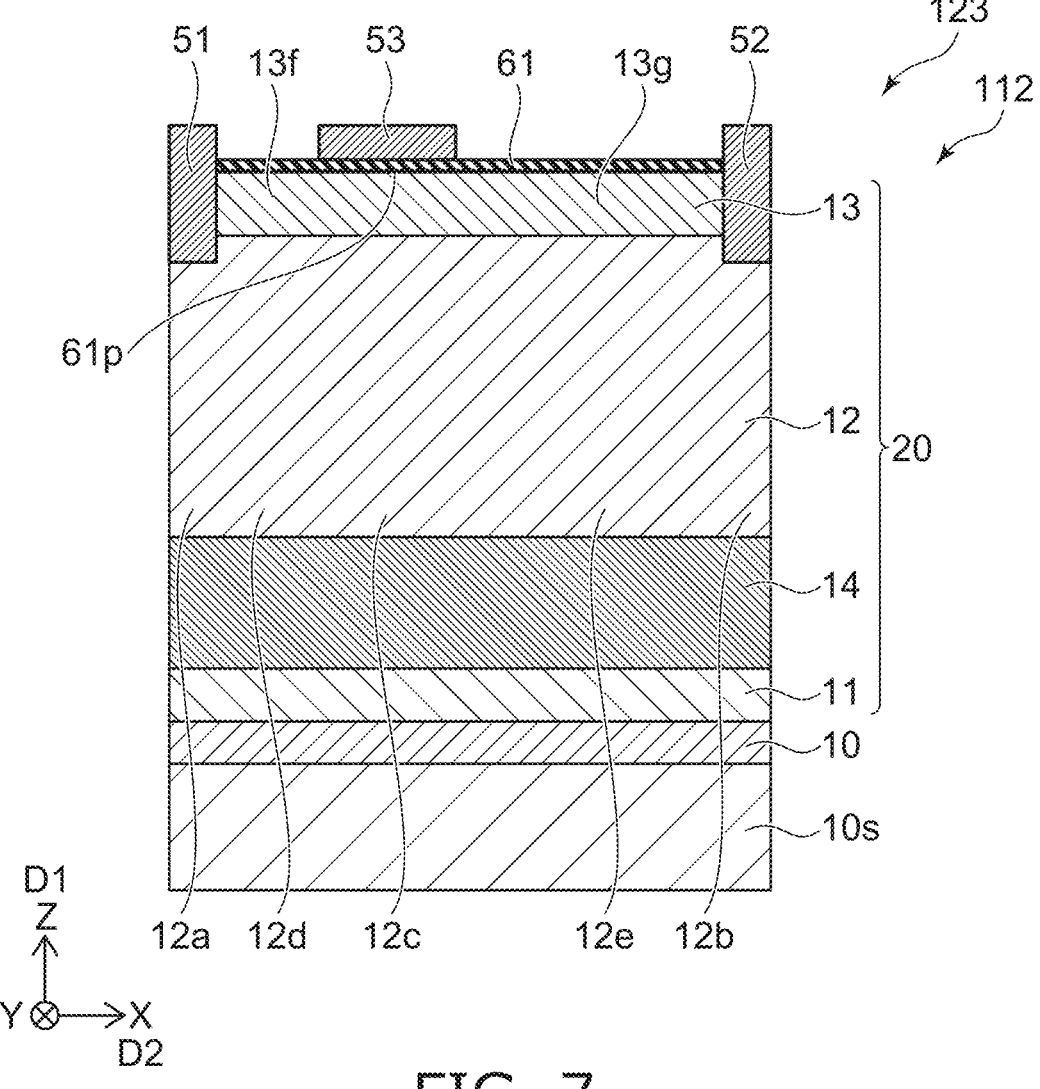
FIG. 7 is a schematic cross-sectional view illustrating a semiconductor device according to the second embodiment.

FIG. 7 is a schematic cross-sectional view illustrating a semiconductor device according to the second embodiment.

As shown in FIG. 7, in a semiconductor device 123 according to the embodiment, the third electrode 53 does not overlap the third nitride layer 13 in the second direction D2. Except for this, the configuration of the semiconductor device 123 may be the same as the configuration of the semiconductor device 122. The semiconductor device 123 is, for example, a normally-on type transistor.

The first electrode 51 includes, for example, at least one selected from the group consisting of aluminum, titanium, nickel, and gold. The second electrode 52 includes, for example, at least one selected from the group consisting of aluminum, titanium, nickel, and gold. The third electrode 53 includes, for example, at least one selected from the group consisting of TiN, WN, Ni, Au, Pt and Ti.

Third Embodiment

Figure 8:
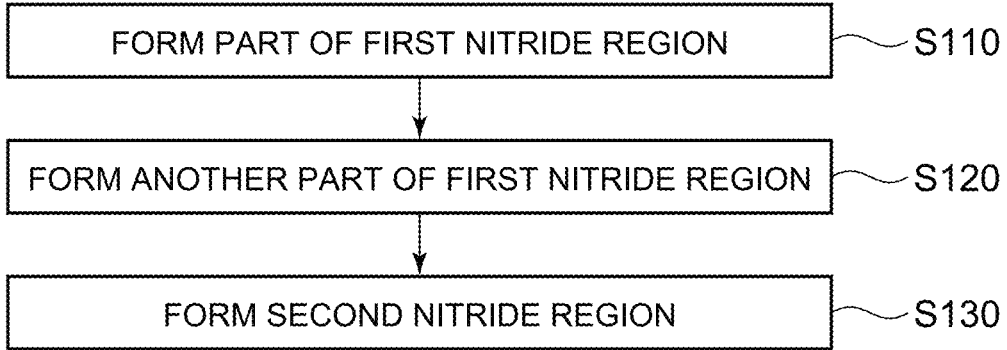
FIG. 8 is a flow chart illustrating a method manufacturing a nitride semiconductor according to a third embodiment.

FIG. 8 is a flow chart illustrating a method manufacturing a nitride semiconductor according to a third embodiment.

As shown in FIG. 8, a method for manufacturing the nitride semiconductor according to the embodiment includes forming a part of a first nitride region 10 (for example, the first portion 10a) including $Al_{x1}Ga_{1-x1}N$ (0.98<x1≤1) on the base body 10s including boron at the first temperature (step S110). A concentration of boron (concentration C0) in the base body 10s is not less than $1 \times 10^{19}$ cm$^{-3}$.

The manufacturing method includes forming an other part of the first nitride region 10 (second portion 10b) on the part of the first nitride region 10 (first portion 10a) at a second temperature (Step S120). The second temperature is higher than the first temperature.

The manufacturing method includes forming a second nitride region 20 including $Al_{x2}Ga_{1-x2}N$ (0≤x2<1, x2<x1) on the other part of the first nitride region 10 (step S130).

By such a manufacturing method, for example, the profile of boron illustrated in FIG. 2A can be obtained. Even when the target high boron concentration C0 is applied to the base body 10s, the diffusion of boron is suppressed. The first nitride region 10 in which the pits are suppressed is obtained. For example, the leakage current is suppressed.

In the embodiment, the first temperature is, for example, not less than 800° C. and not more than 900° C. The second temperature is, for example, not less than 1000° C. and not more than 1100° C. The formation of the first nitride region 10 is performed by, for example, a MOCVD method or the like using a gas including a raw material including aluminum (trimethylaluminum: TMAl) and a raw material including nitrogen (ammonia: $NH_3$).

For example, the formed first nitride region 10 includes the first surface 10f facing the base body 10s and the second surface 10g facing the second nitride region 20. The second concentration C2 of boron on the second surface 10g is, for example, not more than $\frac{1}{8000}$ of the first concentration C1 of boron on the first surface 10f.

Information on the concentration or composition of an element can be obtained by, for example, SIMS (Secondary Ion Mass Spectrometry) or EDX (Energy dispersive X-ray spectroscopy). Information on the thickness can be obtained by observing with an electron microscope.

According to the embodiment, it is possible to provide a nitride semiconductor, a semiconductor device, and a method for manufacturing the nitride semiconductor, which can improve the characteristics.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nitride semiconductor such as nitride regions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductors, semiconductor devices, and methods for manufacturing nitride semiconductors practicable by an appropriate design modification by one skilled in the art based on the nitride semiconductors, the semiconductor devices, and the methods for manufacturing nitride semiconductors described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor, comprising:
a base body including boron;
a first nitride region including $Al_{x1}Ga_{1-x1}N$ where $0.98<x1\leq1$; and
a second nitride region including $Al_{x2}Ga_{1-x2}N$ wherein $0\leq x2<1$, and $x2<x1$,
wherein
a concentration of boron in the base body is not less than $1\times10^{19}$ cm$^{-3}$,
the first nitride region is between the base body and the second nitride region, a thickness of the first nitride region in a direction from the base body to the first nitride region is not less than 100 nm and not more than 250 nm,
the first nitride region comprises a first surface facing the base body having a first concentration of boron and a second surface facing the second nitride region having a second concentration of boron,
the second nitride region has a third concentration of boron which is not more than the second concentration of boron,
the first concentration is not less than $5\times10^{19}$ cm$^{-3}$,
the second concentration is not more than $8\times10^{16}$ cm$^{31\ 3}$,
the third concentration is not more than $1\times10^{16}$ cm$^{-3}$, and
the second concentration of boron in the second surface is not more than $\frac{1}{8000}$ of the first concentration of boron in the first surface.

2. The semiconductor according to claim 1, wherein the second concentration is not more than $\frac{1}{10000}$ of the first concentration.

3. The semiconductor according to claim 1, wherein the second concentration is not more than $\frac{1}{2500}$ of the concentration of the boron in the base body.

4. The semiconductor according to claim 1, wherein the base body includes silicon.

5. The semiconductor according to claim 1, wherein the first concentration is higher than the concentration of the boron in the base body.

6. The semiconductor according to claim 1, wherein the first nitride region includes AlN.

7. The semiconductor according to claim 1, wherein the second nitride region comprises a first nitride layer including $Al_yGa_{1-y}N$ where $0<y1<1$, and $y1<x1$, and the first nitride layer is in contact with the first nitride region.

8. The semiconductor according to claim 7, wherein the second nitride region further comprises:
a second nitride layer including $Al_{y2}Ga_{1-y2}N$ where $0\leq y2<1$,
a third nitride layer including $Al_{y3}Ga_{1-y3}N$ where $y2<y3<x1$, and
the second nitride layer is between the first nitride layer and the third nitride layer in a first direction from the base body to the first nitride region.

9. The semiconductor according to claim 8, wherein the second nitride region further comprises a fourth nitride layer,
the fourth nitride layer is between the first nitride layer and the second nitride layer,
the fourth nitride layer includes a plurality of first films including $Al_{z1}Ga_{1-z1}N$ where $0\leq z1<1$ and a plurality of second films including $Al_{z2}Ga_{1-z2}N$ where $0<z2\leq1$, and $z1<z2$,
one of the second films is between one of the first films and another one of the first films in the first direction, and
the one of the first films is between the one of the second films and another one of the second films in the first direction.

10. The semiconductor according to claim 9, wherein a thickness of the one of the first films in the first direction is not less than 20 nm and not more than 30 nm, and
a thickness of the one of the second films in the first direction is not less than 3 nm and not more than 8 nm.

11. The semiconductor according to claim 1, wherein the second nitride region comprises:
a second nitride layer including $Al_{y2}Ga_{1-y2}N$ where $0\leq y2<1$, a third nitride layer including $Al_{y3}Ga_{1-y3}N$ where y2<y3<x1, and the second nitride layer is between the first nitride region and the third nitride layer in a first direction from the base body to the first nitride region.

12. A semiconductor device, comprising:

the semiconductor according to claim 1;

a first electrode;

a second electrode;

a third electrode; and an insulating member, a direction from the first electrode to the second electrode being along a second direction crossing the first direction, a position of the third electrode in the second direction being between a position of the first electrode in the second direction and a position of the second electrode in the second direction, the second nitride layer including a first partial region, a second partial region, a third partial region, a fourth partial region and a fifth partial region, a direction from the first partial region to the first electrode being along the first direction, a direction from the second partial region to the second electrode being along the first direction, a position of the third partial region in the second direction being between a position of the first partial region in the second direction and a position of the second partial region in the second direction, a direction from the third partial region to the third electrode being along the first direction, the fourth partial region being between the first partial region and the third partial region in the second direction, the fifth partial region being between the third partial region and the second partial region in the second direction, the third nitride layer including a sixth partial region and a seventh partial region, a direction from the fourth partial region to the sixth partial region being along the first direction, a direction from the fifth partial region to the seventh partial region being along the first direction, and the insulating member being provided between the third partial region and the third electrode in the first direction.

13. The device according to claim 12, wherein at least a part of the third electrode is between the sixth partial region and the seventh partial region.

14. A method for manufacturing a nitride semiconductor according to claim 1, comprising:

forming a part of a first nitride region on a base body including boron at a first temperature, the first nitride region including $Al_{x1}Ga_{1-x1}N$ where 0.98<x1≤1;

forming another part of the first nitride region on the part of the first nitride region at a second temperature higher than the first temperature; and forming a second nitride region on the other part of the first nitride region, the second nitride region including $Al_{x2}Ga_{1-x2}N$ where 0≤x2<1, and x2<x1.

15. The method according to claim 14, wherein the first nitride region includes a first surface facing the base body and a second surface facing the second nitride region, and a second concentration of boron in the second surface is not more than $\frac{1}{8000}$ of a first concentration of boron in the first surface.

* * * * *